(12) United States Patent
Berdy et al.

(10) Patent No.: US 9,807,882 B1
(45) Date of Patent: Oct. 31, 2017

(54) DENSITY-OPTIMIZED MODULE-LEVEL INDUCTOR GROUND STRUCTURE

(71) Applicant: QUALCOMM Incorporated, San Diego, CA (US)

(72) Inventors: David Francis Berdy, San Diego, CA (US); Changhan Hobie Yun, San Diego, CA (US); Niranjan Sunil Mudakatte, San Diego, CA (US); Mario Francisco Velez, San Diego, CA (US); Chengjie Zuo, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/239,751

(22) Filed: Aug. 17, 2016

(51) Int. Cl.
| | |
|---|---|
| *H01L 23/48* | (2006.01) |
| *H05K 1/11* | (2006.01) |
| *H05K 3/40* | (2006.01) |
| *H05K 3/30* | (2006.01) |
| *H05K 1/03* | (2006.01) |
| *H05K 1/18* | (2006.01) |
| *H01F 27/28* | (2006.01) |
| *H05K 3/06* | (2006.01) |
| *H03H 7/01* | (2006.01) |
| *H03H 7/46* | (2006.01) |
| *H01L 49/02* | (2006.01) |
| *H01L 23/66* | (2006.01) |
| *H01Q 1/48* | (2006.01) |
| *H01Q 1/36* | (2006.01) |
| *H01Q 1/38* | (2006.01) |
| *H01Q 1/24* | (2006.01) |

(52) U.S. Cl.
CPC ......... *H05K 1/181* (2013.01); *H01F 27/2804* (2013.01); *H01L 23/66* (2013.01); *H01L 28/10* (2013.01); *H01Q 1/241* (2013.01); *H01Q 1/36* (2013.01); *H01Q 1/38* (2013.01); *H01Q 1/48* (2013.01); *H03H 7/0138* (2013.01); *H03H 7/46* (2013.01); *H05K 3/06* (2013.01); *H05K 3/303* (2013.01); *H01L 2223/6672* (2013.01); *H01L 2223/6677* (2013.01); *H05K 2201/1003* (2013.01)

(58) Field of Classification Search
CPC ....... H01L 28/10; H01L 23/573; H01L 23/66; H01L 2223/6622; H01L 23/5227; H01L 23/645; H01L 2924/00; H05K 1/0233; H05K 3/303; H05K 1/0306; H05K 2203/1316; H01K 1/181; Y10T 29/4902; Y10T 29/4913
See application file for complete search history.

(56) References Cited

U.S. PATENT DOCUMENTS

| | | |
|---|---|---|
| 6,621,141 B1 | 9/2003 | Van Schuylenbergh et al. |
| 7,382,219 B1 | 6/2008 | Lee |
| 7,911,066 B2 | 3/2011 | Ehlers et al. |

(Continued)

*Primary Examiner* — Jasmine Clark
(74) *Attorney, Agent, or Firm* — Seyfarth Shaw LLP (57) ABSTRACT

An integrated circuit (IC) device may include a first substrate having an inductor ground plane in a conductive layer of the first substrate. The integrated circuit may also include a first inductor in a passive device layer of a second substrate that is supported by the first substrate. A shape of the inductor ground plane may substantially correspond to a silhouette of the first inductor.

20 Claims, 10 Drawing Sheets

(56) References Cited

U.S. PATENT DOCUMENTS

| | | | |
|---|---|---|---|
| 8,324,028 B2 * | 12/2012 | Kissing | H01L 23/5227 257/724 |
| 8,427,266 B2 | 4/2013 | Wu et al. | |
| 8,559,186 B2 | 10/2013 | Jin | |
| 2002/0017699 A1 * | 2/2002 | Shenoy | H01L 23/50 257/531 |
| 2009/0212402 A1 * | 8/2009 | Nakashiba | H01L 23/5225 257/659 |

* cited by examiner

DENSITY-OPTIMIZED MODULE-LEVEL INDUCTOR GROUND STRUCTURE

BACKGROUND

Field

Aspects of the present disclosure relate to semiconductor devices, and more particularly to a density-optimized, module-level inductor ground structure for high quality (Q)-factor radio frequency (RF) applications.

Background

The process flow for semiconductor fabrication of integrated circuits (ICs) may include front-end-of-line (FEOL), middle-of-line (MOL), and back-end-of-line (BEOL) processes. The front-end-of-line processes may include wafer preparation, isolation, well formation, gate patterning, spacer, extension and source/drain implantation, silicide formation, and dual stress liner formation. The middle-of-line processes may include gate contact formation. Middle-of-line layers may include, but are not limited to, middle-of-line contacts, vias or other layers within close proximity to the semiconductor device transistors or other like active devices. The back-end-of-line processes may include a series of wafer processing steps for interconnecting the semiconductor devices created during the front-end-of-line and middle-of-line processes.

Successful fabrication of modern semiconductor chip products involves interplay between the materials and the processes employed. In particular, the formation of conductive material for the semiconductor fabrication in the back-end-of-line processes is an increasingly challenging part of the process flow. This is particularly true in terms of maintaining a small feature size. The same challenge of maintaining a small feature size also applies to all passive RF technologies, where high-performance components such as inductors and capacitors are built upon a highly insulative substrate that may also have a very low loss.

Passive on glass devices involve high-performance inductor and capacitor components that have a variety of advantages over other technologies, such as surface mount technology or multi-layer ceramic chips that are commonly used in the fabrication of mobile radio frequency (RF) chips (e.g., mobile RF transceivers). The design complexity of mobile RF transceivers is complicated by the migration to a deep sub-micron process node due to cost and power consumption considerations. Mobile RF transceiver design is further complicated by added circuit functions to support communication enhancements. Further design challenges for mobile RF transceivers include analog/RF performance considerations, such as mismatch, noise and other performance considerations. The design of these mobile RF transceivers includes the use of passive devices, for example, to suppress resonance, and/or to perform filtering, bypassing and coupling in high power system-on-chip (SoC) devices, such as application processors and graphics processors.

SUMMARY

An integrated circuit (IC) device may include a first substrate having an inductor ground plane in a conductive layer of the first substrate. The integrated circuit may also include a first inductor in a passive device layer of a second substrate that is supported by the first substrate. A shape of the inductor ground plane may substantially correspond to a silhouette of the first inductor.

A method of making an integrated circuit device may include placing a second substrate, having a passive device layer including a first inductor, on a first substrate. The method may also include fabricating an inductor ground plane in a conductive layer of the first substrate. A shape of the inductor ground plane may substantially corresponding to a silhouette of the first inductor.

A radio frequency (RF) front end module may include a filter. The filter may include a first substrate having an inductor ground plane in a conductive layer of the first substrate. The filter may also include a first inductor in a passive device layer of a second substrate that is supported by the first substrate. A shape of the inductor ground plane may substantially correspond to a silhouette of the first inductor. The RF front end module may also include a diplexer coupled to the filter and an antenna coupled to an output of the diplexer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, such as mismatch, noise, and other performance considerations. The design of these mobile RF transceivers includes the use of passive devices, for example, to suppress resonance and/or to perform filtering, bypassing, and coupling.

Passive on glass devices involve high-performance inductor and capacitor components that have a variety of advantages over other technologies, such as surface mount technology or multi-layer ceramic chips that are commonly used in the fabrication of mobile RF chips. These advantages include being more compact in size and having smaller manufacturing variations. Passive on glass devices also involve a higher quality (Q)-factor value that meets stringent low insertion loss and low power consumption specifications. Passive devices such as inductors may be implemented as two-dimensional (2D) structures with passive on glass technologies. 2D inductors or other passive devices may also experience a number of design constraints depending on their implementation.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at high frequency (e.g., 500 megahertz (MHz) to 5 gigahertz (GHz) RF range).

Various aspects of the disclosure provide techniques for fabrication of a density-optimized, module-level inductor ground structure. The process flow for semiconductor fabrication of the density-optimized, module-level inductor ground structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

As described herein, the back-end-of-line interconnect layers may refer to the conductive interconnect layers (e.g., metal one (M1), metal two (M2), metal three (M3), etc.) for electrically coupling to front-end-of-line active devices of an integrated circuit. The back-end-of-line interconnect layers may electrically couple to middle-of-line interconnect layers for, for example, connecting M1 to an oxide diffusion (OD) layer of an integrated circuit. A back-end-of-line first via (V2) may connect M2 to M3 or others of the back-end-of-line interconnect layers. The front-end-of-line processes may include the set of process steps that form the active devices, such as transistors, capacitors, and diodes. The front-end-of-line processes include ion implantation, anneals, oxidation, CVD (chemical vapor deposition) or ALD (atomic layer deposition), etching, CMP (chemical mechanical polishing), and epitaxy.

The middle-of-line processes may include the set of process steps that enable connection of the transistors to the back-end-of-line interconnects (e.g., M1 . . . M8). These steps include silicidation and contact formation as well as stress introduction. The back-end-of-line processes may include the set of process steps that form the interconnect that ties the independent transistors and form circuits. Currently, copper and aluminum are used to form the interconnects using various process technologies such as sputtering, spraying, and plating, but with further development of the technology, other conductive materials may be used.

The noted migration of mobile RF transceivers, including passive on glass and/or integrated passive devices, to deep sub-micron process nodes complicates the design of the passive on glass/integrated passive devices. In particular, spacing considerations affect performance of the passive on glass/integrated passive devices of the mobile RF transceivers at the deep sub-micron process nodes. For example, a distance between a passive device plane (e.g., a passive on glass (POG) device plane and/or an integrated passive device (IPD) plane) and a ground plane of a system board (e.g., a printed circuit broad (PCB)) may negatively affect the performance of the RF devices of the RF transceiver.

As further noted above, the design complexity of mobile RF transceivers is complicated by added circuit functions to support communication enhancements, such as carrier aggregation. While carrier aggregation enables maximization of available bandwidth by simultaneously using multiple frequencies for a single communication stream, successful implementation of carrier aggregation is complicated by noise created at the harmonic frequencies due to the frequencies used for data transmission. This noise is reduced when passive devices are used to process signals carried in a carrier aggregation system. Unfortunately, eddy currents generated by inductors may negatively affect the performance of mobile RF transceivers when the eddy currents are orthogonal to a ground plane of the system board in the mobile RF transceivers.

According to aspects of the present disclosure, a passive substrate includes a passive device layer having passive on glass (POG) devices and/or integrated passive devices (IPD), in which the passive substrate is supported by a laminate substrate. The laminate substrate may include a ground plane to terminate the magnetic field from the inductors within the passive device layer of the passive substrate. Termination of the inductor magnetic field also prevents negative interaction between eddy currents and a ground plane of a system board supporting the laminate substrate.

Unfortunately, the arrangement of the ground plane within the laminate substrate (e.g., a package substrate) may also be constrained due to supplier specifications to prevent warpage of the laminate substrate. For example, the supplier specifications may include a metal density specification (e.g., 10% mismatch tolerance between opposite substrate layers) between opposite layers of the laminate substrate. This metal density specification is violated when dimensions of the ground plane within the laminate substrate correspond to the dimensions of the passive device layer of the passive substrate. The ground plane design is further complicated by fill specifications for preventing substrate warpage. That is, the laminate substrate metal density and fill specifications complicate the ground plane design.

Aspects of the present disclosure describe a density-optimized, module-level inductor ground structure for high quality (Q)-factor radio frequency (RF) applications. In one arrangement, an integrated circuit device includes a package substrate having a ground plane in a conductive layer of the package substrate. The integrated circuit (IC) device also includes an inductor on a passive substrate that is supported by the packaging substrate. In this arrangement, the ground plane has a silhouette substantially corresponding to a shape of the inductor. Alternatively, the ground plane may be larger than the silhouette. In addition, the conductive layer may be a layer furthest from the inductor.

According to a further aspect of the present disclosure, the integrated circuit device may also include a second, non-critical inductor, such as an inductor for a pass band filter, in which ensuring precise inductor control and reduced coupling to inductor traces is not critical. In this arrangement, the ground plane does not substantially correspond to a silhouette of the second, non-critical inductor. That is, performance of the non-critical inductor is sacrificed in favor of the first, critical inductor, by arranging the ground plane to substantially correspond to the shape of the first, critical inductor, while complying with laminate substrate design rules to prevent warpage. In aspects of the present disclosure, substantially corresponding means overlapping 70%; although a higher overlap yields better performance.

Figure 1:
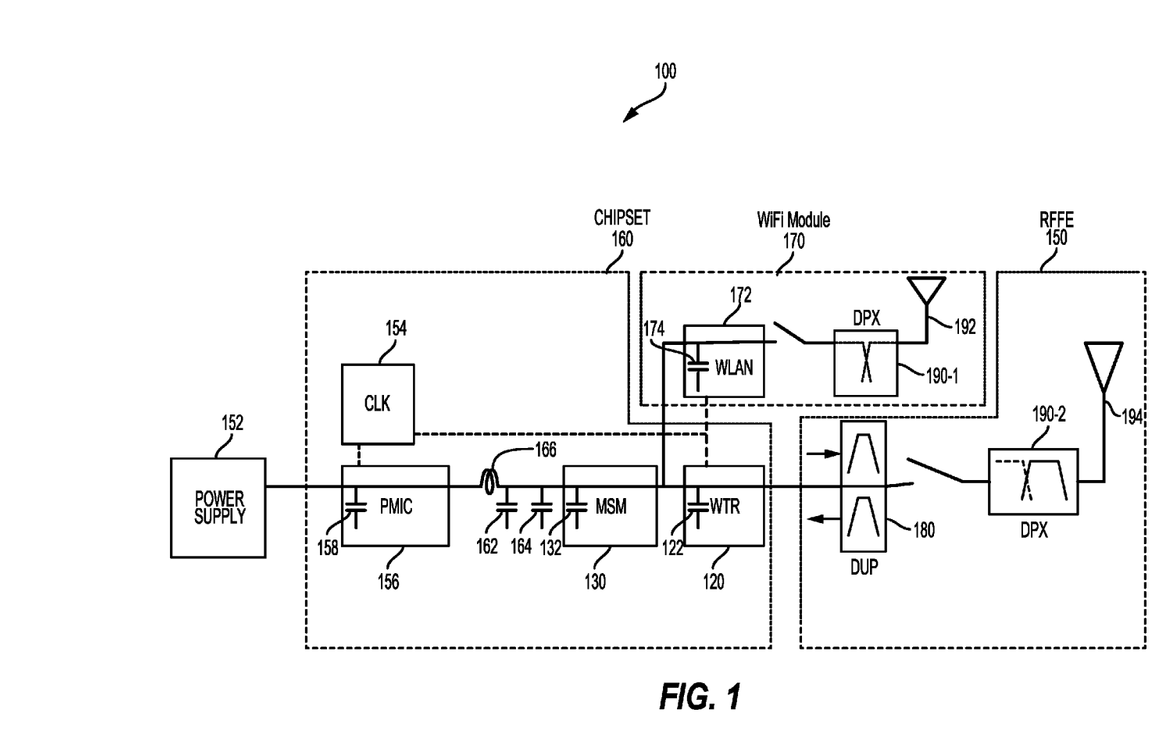
FIG. 1 is a diagram of a radio frequency (RF) communication system in accordance with an aspect of the present disclosure.

FIG. 1 is a schematic diagram of a radio frequency (RF) communications system 100 including a density-optimized, module-level inductor ground structure integrated with a filter according to an aspect of the present disclosure. Representatively, the RF communications system 100 includes a WiFi module 170 having a first diplexer 190-1 and an RF front end module 150 including a second diplexer 190-2 for a chipset 160 to provide carrier aggregation according to an aspect of the present disclosure. The WiFi module 170 includes the first diplexer 190-1 communicably coupling an antenna 192 to a wireless local area network module (e.g., WLAN module 172). The RF front end module 150 includes the second diplexer 190-2 communicably coupling an antenna 194 to a wireless transceiver (WTR) 120 through the duplexer 180. The wireless transceiver 120 and the WLAN module 172 of the WiFi module 170 are coupled to a modem (mobile station modem (MSM), e.g., baseband modem) 130 that is powered by a power supply 152 through a power management integrated circuit (PMIC) 156.

The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components. The RF communications system 100 may also include a power amplifier (PA) integrated with the duplexer 180 (e.g., a PAMID module). The duplexer 180 may filter the input/output signals according to a variety of different parameters, including frequency, insertion loss, rejection or other like parameters.

The RF front end module 150 may include inductors (L) and capacitors (C) arranged to form diplexers, triplexers, multiplexers, low pass filters, balun filters, and/or notch filters to prevent high order harmonics. These passive devices and components may be implemented as passive on glass devices, integrated passive devices, or other like passive devices. The inductors may be three-dimensional (3D) inductors or two-dimensional (2D) spiral inductors. Arrangement of these passive devices may be performed and selected to improve device performance, while suppressing unwanted noise (e.g., artificial harmonics) to support advanced RF applications such as carrier aggregation. One possible configuration of these passive devices is an arrangement of the passive devices within a passive device layer, for example, as shown in FIG. 2.

Figure 2:
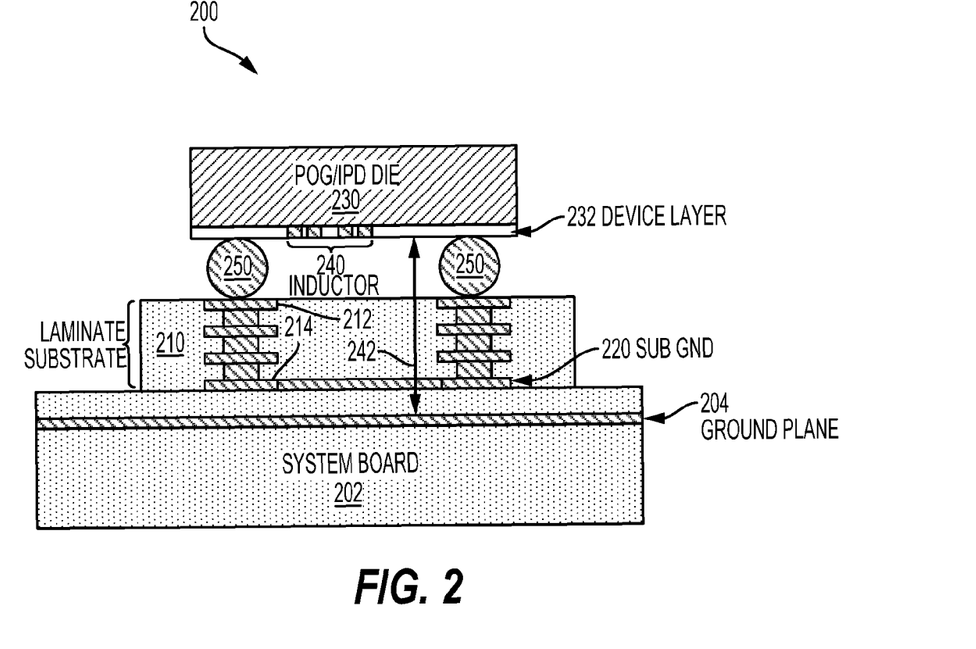
FIG. 2 is a block diagram of a cross-section view of an integrated circuit device including a laminate substrate ground structure.

FIG. 2 is a block diagram of a cross-section view of an integrated circuit device 200 including a module-level laminate substrate ground structure. In this configuration, the integrated circuit device 200 includes a first substrate 210 having a substrate ground plane 220. The first substrate 210 may be a package substrate, a wafer level chip scale package (WLCSP), an interposer, or other like laminate substrate. The first substrate 210 is supported by a system board 202 that includes a board ground plane 204. The system board 202 may be a printed circuit board (PCB) or other like system board.

The integrated circuit device 200 also includes a second substrate 230 (e.g., a passive substrate or a passive die) having a passive device layer 232 including an inductor. As described herein, the term "passive substrate" may refer to a substrate of a diced wafer or panel, or may refer to the substrate of a wafer/panel that is not diced. In one configuration, the passive substrate is comprised of glass, quartz, sapphire, high-resistivity silicon, or other like passive material. The passive substrate may also be a coreless substrate.

The passive device layer 232 may include passive devices and components implemented as passive on glass devices, integrated passive devices, or other like passive devices, for example, as shown in FIG. 2. The passive device layer 232 may include, for example, inductors (L) and capacitors (C) arranged along the passive device layer 232, shown as inductor 240. These various inductors and capacitors may be arranged in the passive device layer 232 to form diplexers, triplexers, low pass filters, balun filters, and/or notch filters to prevent high order harmonics in the RF front end module 150, as shown in FIG. 1.

FIG. 2 also shows a distance 242 between the passive device layer 232 and the board ground plane 204 of the system board 202. In operation, the distance 242 between the passive device layer 232 and the board ground plane 204 of the system board 202 may negatively affect the operation of the integrated circuit device 200. In particular, eddy currents generated by an inductor magnetic field from the passive device layer 232 may negatively interact with the board ground plane 204. The negative interaction is especially acute when a direction of the inductor magnetic field is orthogonal to the board ground plane 204. In particular, when the distance 242 is less than two-hundred (200) microns, the inductor magnetic field from the passive device layer 232 interacts with the board ground plane 204, which negatively affects a performance (e.g., a quality (Q)-factor) of the passive devices in the passive device layer 232.

Unfortunately, solving this problem by simply controlling the distance 242 is difficult because the specification of the board ground plane 204 of the system board 202 generally varies according to specific design and/or supplier specifications. In addition, controlling the height of conductive interconnects 250 (e.g., solder balls) that couple the first substrate 210 to the second substrate 230 is challenging due to the complex assembly process for fabricating the integrated circuit device 200. One technique for preventing the negative interaction between, for example, the inductor 240 of the passive device layer 232 and the board ground plane 204 is the use of a substrate ground plane 220 (Sub GND). The substrate ground plane 220 may shield the devices of the passive device layer 232 to ensure the performance of the integrated circuit.

Unfortunately, the arrangement of the substrate ground plane within the first substrate 210 may also be constrained by supplier specifications to prevent warpage of the first substrate 210. For example, the supplier specifications may include a metal density specification (e.g., 10% mismatch tolerance between opposite substrate layers) between opposite layers, such as a first conductive layer 212 (e.g., M1) and a fourth conductive layer 214 of the first substrate 210. This metal density specification is violated when dimensions of the substrate ground plane 220 within the first substrate 210 correspond to the dimensions of the passive device layer 232 of the second substrate 230. The design of the substrate ground plane 220 is further complicated by fill specifications for preventing substrate warpage. That is, the metal density and fill specifications of the first substrate 210 complicate the ground plane design.

Figure 3:
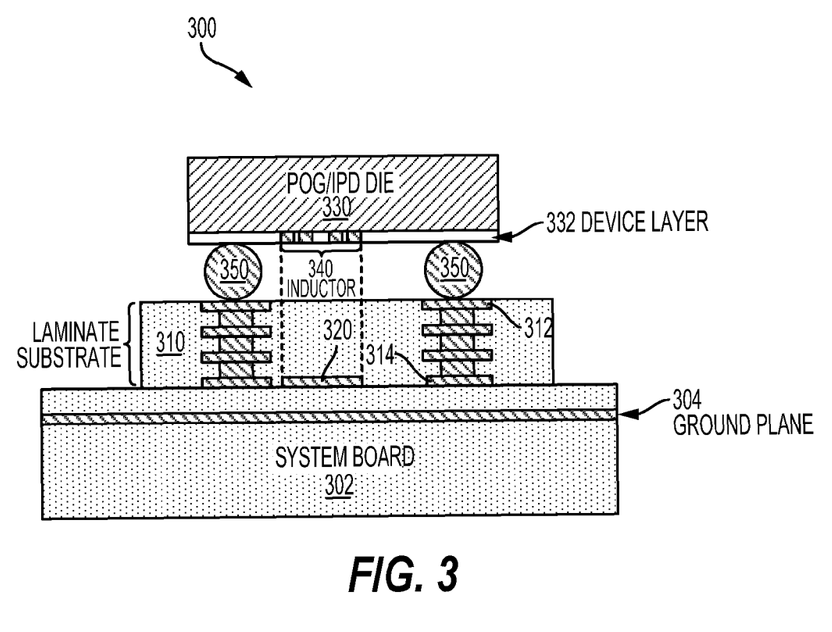
FIG. 3 is a block diagram illustrating an integrated circuit device having a density-optimized, module-level inductor ground structure for high quality (Q)-factor radio frequency (RF) applications, according to aspects of the present disclosure.

Aspects of the present disclosure describe a density-optimized, module-level inductor ground structure for high quality (Q)-factor radio frequency (RF) applications, for example, as shown in FIG. 3. In this arrangement, a substrate ground plane has a silhouette substantially corresponding to a shape of an inductor in a passive device layer. Alternatively, the ground plane may be larger than the silhouette of the inductor in the passive device layer. In addition, the substrate ground plane may be arranged in a conductive layer that is furthest from the inductor.

FIG. 3 is a block diagram of a cross-section view illustrating an integrated circuit device 300 having a density-optimized, module-level inductor ground structure for high quality (Q)-factor radio frequency (RF) applications, according to aspects of the present disclosure. In this configuration, the integrated circuit device 300 includes a first substrate 310. The first substrate 310 may be a package substrate, a wafer level chip scale package (WLCSP), an interposer, or other like laminate substrate. The first substrate 310 is supported by a system board 302 that includes a board ground plane 304. The system board 302 may be a printed circuit board (PCB) or other like system board.

The integrated circuit device 300 also includes a second substrate 330 (e.g., a passive substrate) having a passive device layer 332. The passive device layer 332 includes a first inductor 340. The passive device layer 332 may also include passive devices and components implemented as passive on glass devices, integrated passive devices, or other like passive devices, for example, as shown in FIG. 3. In addition, conductive interconnects 350 (e.g., a solder ball) electrically couple the first substrate 310 to the passive device layer 332. In this configuration shown in FIG. 3, however, a shape of an inductor ground plane 320 in the first substrate 310 substantially corresponds to a silhouette of the first inductor 340.

In this arrangement of the inductor ground plane 320, an inductor magnetic field of the first inductor 340 is substantially shielded from the board ground plane 304 of the system board 302 to prevent any negative interaction with the board ground plane 304. As a result, the board ground plane 304 does not degrade the performance of the first inductor 340 in the passive device layer 332. In addition, arranging a shape of the inductor ground plane 320 according to a silhouette of the first inductor 340 complies with a metal density specification of the first substrate 310. For example, the reduced size of the inductor ground plane 320, relative to the substrate ground plane 220 of FIG. 2, complies with a ten percent (10% mismatch tolerance between opposite substrate layers) metal density specification between opposite layers, such as a first conductive layer 312 (e.g., M1) and a fourth conductive layer 314 (e.g., M4) of the first substrate 310.

Figure 4A:
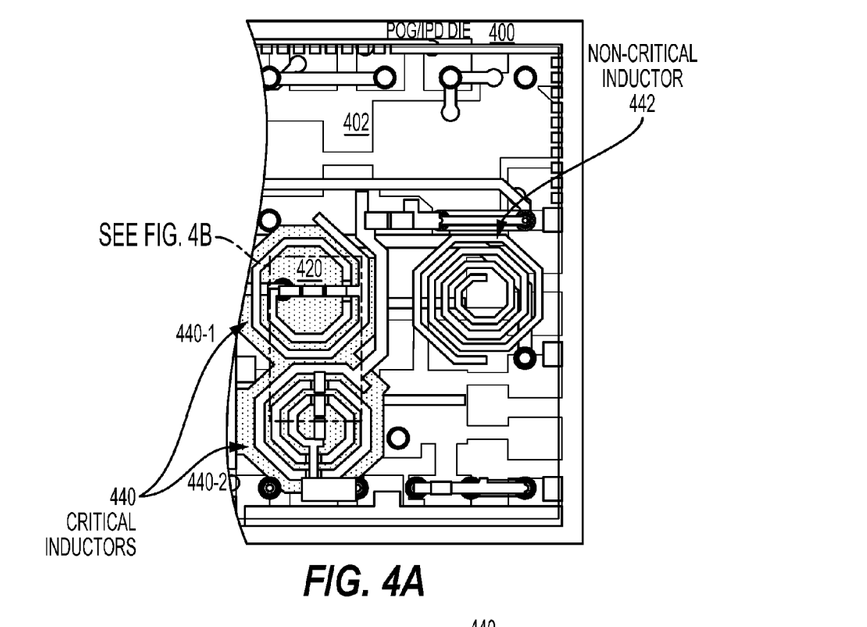
FIGS. 4A and 4B illustrate a passive die including a density-optimized, module-level inductor ground structure for high quality (Q)-factor radio frequency (RF) applications, according to aspects of the present disclosure.
Figure 4B:
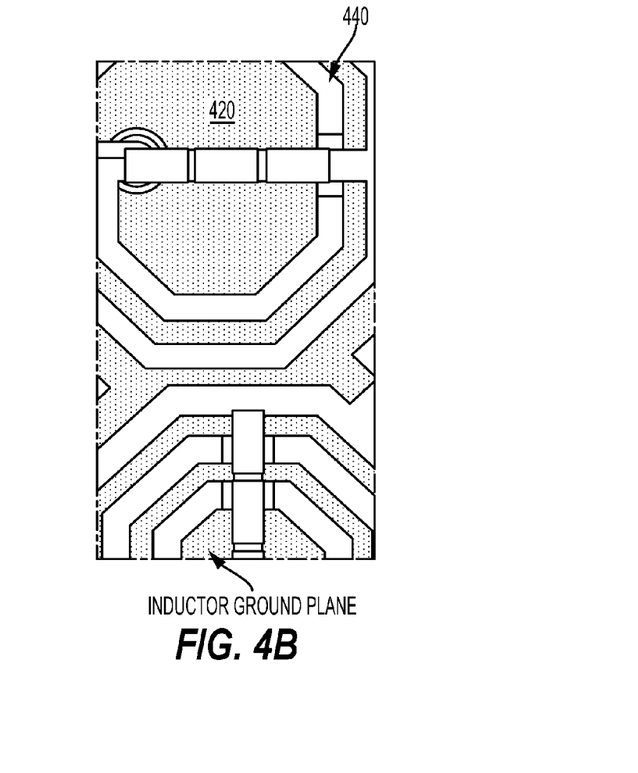

FIGS. 4A and 4B illustrate a passive die 400 including a density-optimized, module-level inductor ground structure for high quality (Q)-factor radio frequency (RF) applications, according to aspects of the present disclosure. FIG. 4A shows a top view of the passive die 400 including passive on glass (POG) devices and/or integrated passive devices (IPDs) arranged, for example, in a passive device layer. In this arrangement, a first inductor 440-1 and a second inductor 440-2 of a pair of spiral 2D inductors may be critical inductors of a notch filter or other like RF filter. By contrast, a third inductor 442 may be a non-critical inductor of a passband filter or other like RF filter.

In this aspect of the present disclosure, a shape of an inductor ground plane 420 substantially corresponds to a silhouette of the first inductor 440-1 and the second inductor 440-2. By contrast, the inductor ground plane 420 does not correspond to the silhouette of the third inductor 442. As a result, the third inductor 442 is exposed to a board ground plane of a system board 402 supporting the passive die 400. That is, performance of the third inductor 442 is sacrificed in favor of the first inductor 440-1 and the second inductor 440-2. Performance of the third inductor 442 is sacrificed in favor of the first inductor 440-1 and the second inductor 440-2 because these critical inductors involve precise control with reduced variation to provide a desired Q-factor and inductance, while complying with a metal density specification.

As shown in the exploded view of FIG. 4B, the first inductor 440-1 and the second inductor 440-2 are composed of spiral trace patterns arranged as a pair of spiral 2D inductor structures in a multi-turn configuration. In this aspect of the present disclosure, a shape of the inductor ground plane 420 overlaps a silhouette of the first inductor 440-1. The overlap may be in the range of fifty to two-hundred (50-200) microns. It should be recognized, however, that the overlap may varying according to the size of the first inductor 440-1.

Figure 5:
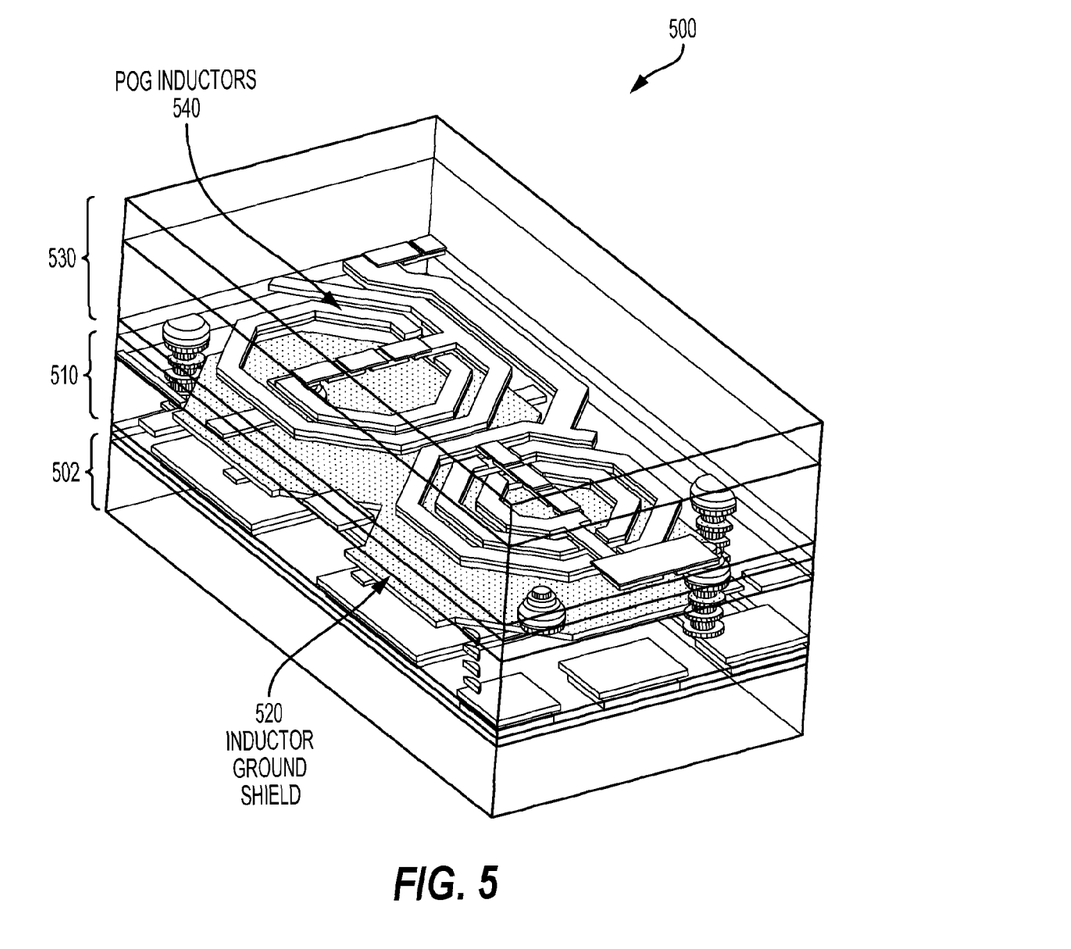
FIG. 5 shows a 3D view of a passive die including a density-optimized, module-level inductor ground structure for high quality (Q)-factor radio frequency (RF) applications, according to aspects of the present disclosure.

FIG. 5 shows a 3D view of a passive die 500 including a density-optimized, module-level inductor ground structure for high quality (Q)-factor radio frequency (RF) applications, according to aspects of the present disclosure. The passive die 500 also includes a system board 502 supporting a first substrate 510, which also supports a second substrate 530. The passive die 500 including a pair of passive on glass (POG) inductors 540 arranged, for example, in a passive device layer of the second substrate 530. In this arrangement, the POG inductors 540 are critical inductors. In this aspect of the present disclosure, the shape of an inductor ground plane 520 substantially corresponds to a silhouette of the POG inductors 540. This arrangement of the inductor ground plane 520 (inductor ground shield) provides a solid, well defined ground reference for the POG inductors 540, while meeting design rule specifications for metal density balance between laminate substrate layers. In addition, conductive fill patterns may be added to the first substrate 510 to comply with minimum/maximum metal density specifications for each layer of the first substrate, for example, as shown in FIG. 6B.

Figure 6A:
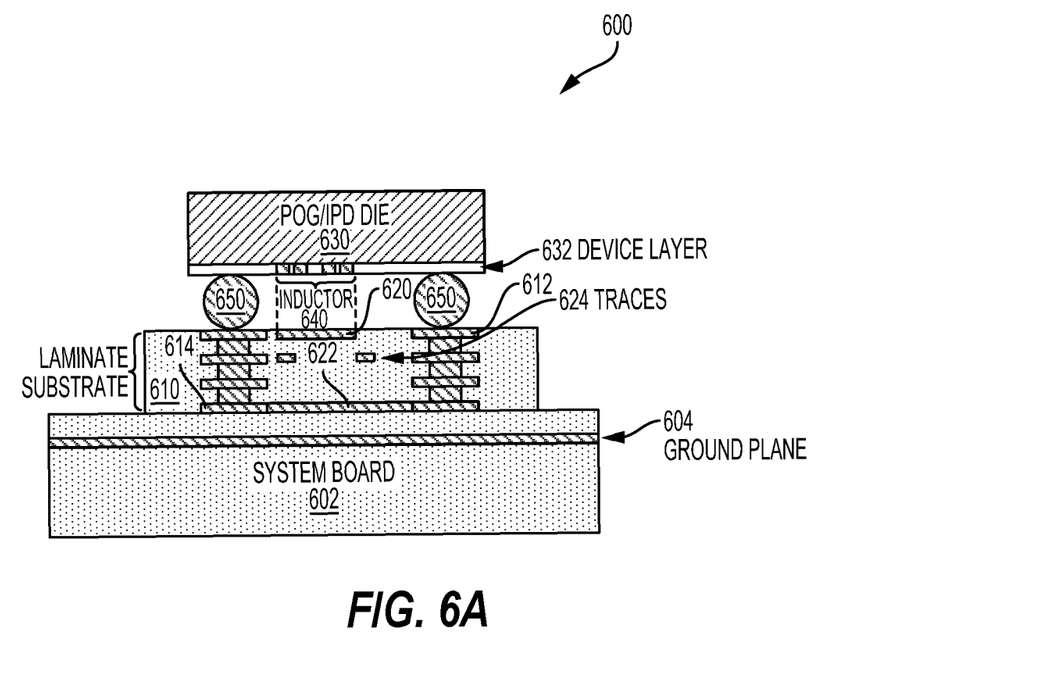
FIGS. 6A and 6B are block diagram illustrating an integrated circuit device having a density-optimized, module-level inductor ground structure for high quality (Q)-factor radio frequency (RF) applications, according to aspects of the present disclosure.
Figure 6B:
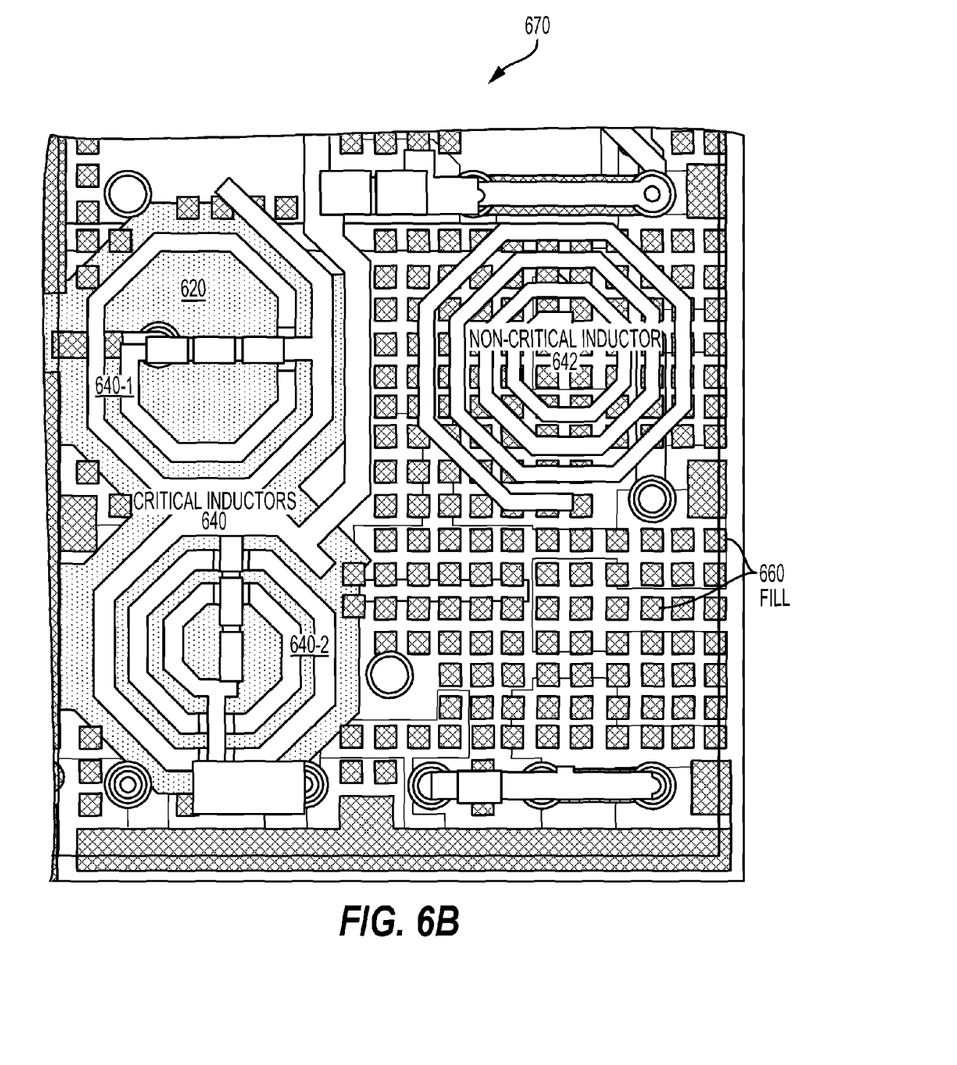

FIG. 6A is a block diagram of a cross section view illustrating an integrated circuit device 600 having a density-optimized, module-level inductor ground structure for high quality (Q)-factor radio frequency (RF) applications, according to aspects of the present disclosure. In this configuration, the integrated circuit device 600 includes a first substrate 610 (e.g., a laminate substrate) that is also supported by a system board 602 that includes a board ground plane 604. The system board 602 may be a printed circuit board (PCB) or other like system board. According to this aspect of the present disclosure, a density of the conductive layers of the first substrate 610 is balanced by a conductive fill pattern of the first substrate 610.

The integrated circuit device 600 also includes a second substrate 630 (e.g., a passive substrate) having a passive device layer 632. The passive device layer 632 also includes a first inductor 640. The passive device layer 632 may include passive devices and components implemented as passive on glass devices, integrated passive devices, or other like passive devices, for example, as shown in FIG. 6. In addition, conductive interconnects 650 (e.g., solder balls) electrically couple the first substrate 610 to the passive device layer 632. In this configuration shown in FIG. 6, however, a shape of an inductor ground plane 620 substantially corresponds to a silhouette of the first inductor 640.

This arrangement of the integrated circuit device 600 includes a substrate ground plane 622 to substantially shield the passive device layer 632 from the board ground plane 604 (e.g., a PCB ground plane) of the system board 602 to prevent any negative interaction with the board ground plane 604. As a result, the board ground plane 604 does not degrade the performance of the first inductor 640 in the passive device layer 632. In addition, placing the inductor ground plane 620 in a first conductive layer 612 (e.g., M1) and the substrate ground place in a fourth conductive layer 614 (e.g., M4) of the first substrate 610 enable compliance with a metal density specification of the first substrate 610. In addition, the introduction of traces 624 in the first substrate 610 provides compliance with minimum/maximum metal density specifications for each layer of the first substrate 610 for preventing warpage, for example, as shown in FIG. 6B.

FIG. 6B shows a top view of the passive die 670 including passive on glass (POG) devices and/or integrated passive devices (IPDs) arranged, for example, in a passive device layer. In this arrangement, a first inductor 640-1 and a second inductor 640-2 of a pair of spiral 2D inductors may also be critical inductors of a notch filter or other like RF filter. By contrast, a third inductor 642 may be a non-critical inductor of a passband filter or other like RF filter. As will be recognized, a configuration of the passive die 670 is similar to the configuration of the passive die 400 of FIG. 4. In the configuration shown in FIG. 6B, however, the introduction of a conductive fill pattern 660 provides compliance with minimum/maximum metal density specifications for each layer of a substrate of the passive die 670 for preventing warpage. That is, in this arrangement, the conductive fill patterns are added to the substrate of the passive die 670 to comply with minimum/maximum metal density specifications for each layer of the substrate.

Figure 7:
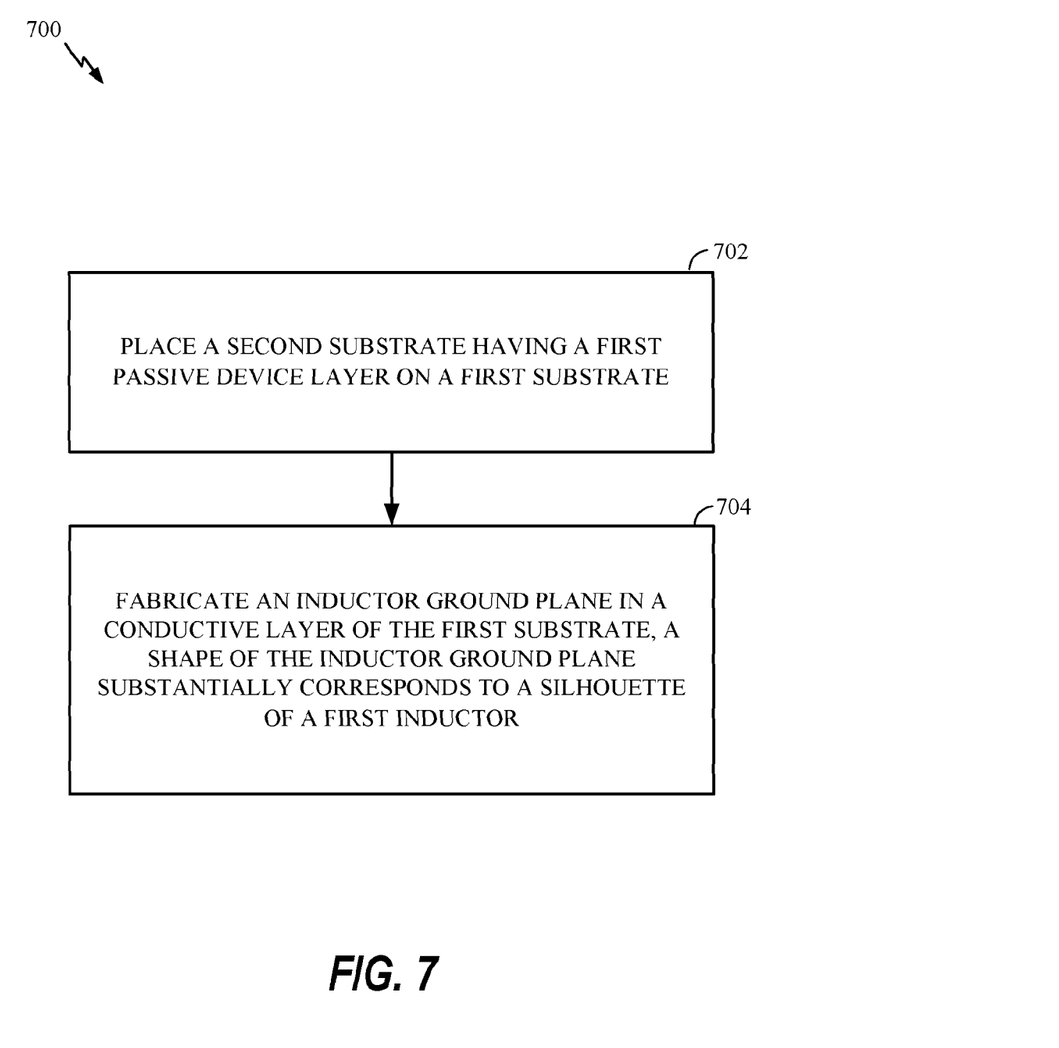
FIG. 7 is a flow diagram illustrating a method of making an integrated circuit device including an inductor ground plane according to aspects of the present disclosure.

FIG. 7 shows a method 700 of making an integrated circuit device including an inductor ground plane according to aspects of the present disclosure. In block 702, a second substrate, having a passive device layer including a first inductor, is placed on a first substrate. For example, as shown in FIG. 3, a second substrate 330 includes a passive device layer 332 having a first inductor 340. In addition, the second substrate 330 (e.g., a POG/IPD die) is supported by a first substrate 310 (e.g., a laminate substrate), which is supported by a system board 302, including a board ground plane 304. In block 704, an inductor ground plane is fabricated in a conductive layer of the first substrate. For example, as shown in FIG. 3, the inductor ground plane 320 is fabricated in an outer conductive interconnect layer 314 (e.g., M4) of the first substrate 310. In this aspect of the present disclosure, a shape of the inductor ground plane 320 substantially corresponds to a silhouette of the first inductor 340, for example, as shown in FIGS. 4A and 4B.

As further shown in FIG. 3, the conductive interconnects 350 (e.g., solder balls) are fabricated on the surface of the first substrate 310 and reflowed to electrically couple the passive device layer 332 of the second substrate 330 to the first substrate 310. In addition, the inductor ground plane may be fabricated by determining the silhouette of the first inductor. Once determined, a conductive material is deposited in the conductive layer of the first substrate. Once deposited, the conductive material is etched to pattern the inductor ground plane according to the silhouette of the first inductor, for example, as shown FIGS. 4A and 4B. In this arrangement, the conductive material is etched to expose a second inductor to a board ground plane of a system board supporting the first substrate.

As noted, placing a ground plane within a laminate substrate (e.g., a package substrate) may be constrained due to supplier specifications to prevent substrate warpage. A metal density specification (e.g., 10% mismatch tolerance between opposite substrate layers) is violated when dimensions of the ground plane within the laminate substrate corresponds to the dimensions of the passive device layer of the passive substrate. Supplier fill specifications for preventing substrate warpage further complicate ground plane design. That is, laminate substrate metal density and fill specifications may lead to rejection of a ground plane design that violates the specifications.

Aspects of the present disclosure describe a density-optimized, module-level inductor ground structure. An inductor ground plane has a silhouette substantially corresponding to a shape of an inductor. Alternatively, the inductor ground plane may be larger than the silhouette of the inductor. The integrated circuit device may also include a second, non-critical inductor, such as a pass band inductor, in which precise inductor control and reduced coupling to inductor traces is not critical. In this configuration, performance of the non-critical inductor is sacrificed in favor of the first, critical inductor, by the ground plane substantially corresponding to the shape of the first, critical inductor, and exposing the non-critical inductor to a board ground plane.

Figure 8:
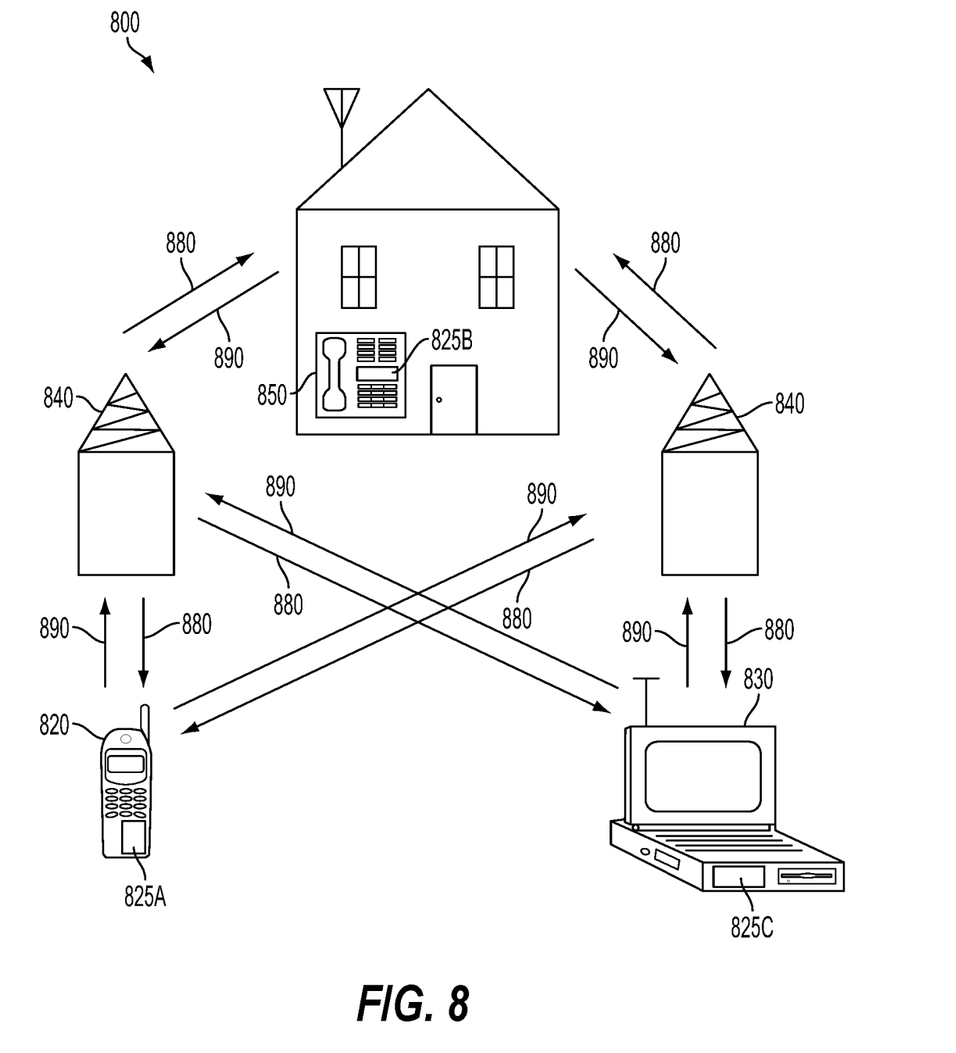
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 each include IC devices 825A, 825C, and 825B having a radio frequency (RF) front end module that includes the disclosed inductor ground plane. It will be recognized that other devices may also include the disclosed ground plane, such as the base stations, switching devices, and network equipment including a RF front end module. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units 820, 830, and 850 may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or a communications device, including an RF front end module, that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed inductor ground plane.

Figure 9:
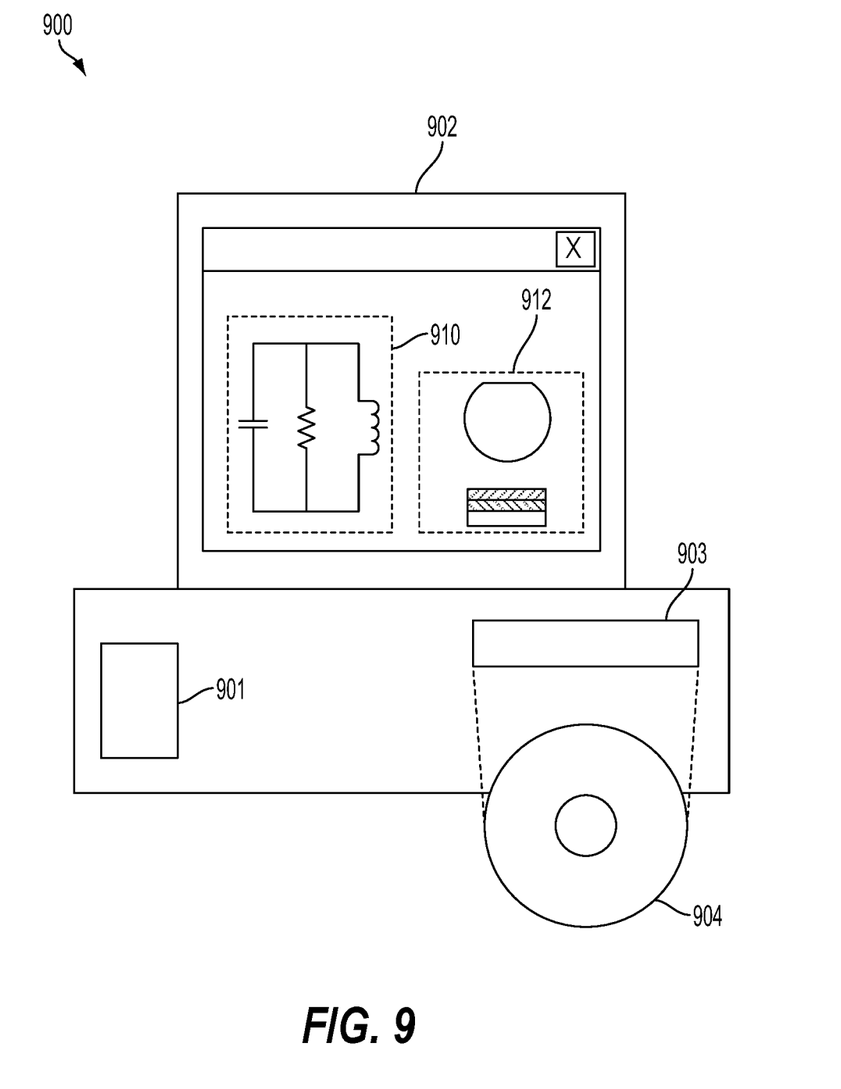
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the inductor ground planes disclosed above. A design workstation 900 includes a hard disk 901 containing operating system software, support files, and design software such as Cadence or OrCAD. The design workstation 900 also includes a display 902 to facilitate design of a circuit 910 or a semiconductor component 912 such as an inductor ground plane. A storage medium 904 is provided for tangibly storing the design of the circuit 910 or the semiconductor component 912. The design of the circuit 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the semiconductor component 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "a step for."

What is claimed is:

1. An integrated circuit (IC) device, comprising:
   a first substrate including an inductor ground plane in a conductive layer of the first substrate; and
   a first inductor in a passive device layer of a second substrate that is supported by the first substrate, a shape of the inductor ground plane substantially corresponding to an outline of the first inductor.

2. The integrated circuit device of claim 1, in which the first substrate comprises a package substrate, supported by a printed circuit board (PCB) having a PCB ground plane.

3. The integrated circuit device of claim 2, further comprising a second inductor in the passive device layer, in which the second inductor is exposed to the PCB ground plane, and the first inductor is shielded from the PCB ground plane by the inductor ground plane.

4. The integrated circuit device of claim 1, in which the second substrate comprises one of a passive substrate or a passive die.

5. The integrated circuit device of claim 1, in which a size of the inductor ground plane is larger than the outline of the first inductor.

6. The integrated circuit device of claim 1, in which the conductive layer is in a layer of the first substrate furthest away from the second substrate.

7. The integrated circuit device of claim 1, in which a metal density of the conductive layer of the first substrate is balanced by a conductive fill pattern of the first substrate.

8. The integrated circuit device of claim 1, in which the shape of the inductor ground plane is rectangular.

9. The integrated circuit device of claim 1, in which the shape of the inductor ground plane is arranged to overlap at least 70% with the outline of the first inductor.

10. The integrated circuit device of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

11. A method of making an integrated circuit device, comprising:
    placing a second substrate, having a passive device layer including a first inductor, on a first substrate; and
    fabricating an inductor ground plane in a conductive layer of the first substrate, a shape of the inductor ground plane substantially corresponding to an outline of the first inductor.

12. The method of claim 11, in which fabricating the inductor ground plane comprises:
    determining the outline of the first inductor;
    depositing a conductive material in the conductive layer of the first substrate; and
    etching the conductive material to pattern the inductor ground plane according to the outline of the first inductor.

13. The method of claim 12, in which fabricating the inductor ground plane further comprises etching the conductive material to expose a second inductor in the first substrate to a board ground plane of a system board supporting the first substrate.

14. The method of claim 11, further comprising:
    integrating the integrated circuit device into a radio frequency (RF) front end module; and
    incorporating the RF front end module into at least one of a music player, a video player, an entertainment unit, a navigation device, a communications device, a personal digital assistant (PDA), a fixed location data unit, a mobile phone, and a portable computer.

15. A radio frequency (RF) front end module, comprising:
    a filter, comprising a first substrate including an inductor ground plane in a conductive layer of the first substrate, a first inductor in a passive device layer of a second substrate that is supported by the first substrate, and a second inductor in the passive device layer coupled to the first inductor, a shape of the inductor ground plane substantially corresponding to an outline of the first inductor and the second inductor;
    a diplexer coupled to the filter; and
    an antenna coupled to an output of the diplexer.

16. The RF front end module of claim 15, in which the first substrate comprises a package substrate, supported by a printed circuit board (PCB) having a PCB ground plane.

17. The RF front end module of claim 16, further comprising a third inductor in the passive device layer, in which the third inductor is exposed to the PCB ground plane, and the first inductor and the second inductor are shielded from the PCB ground plane by the inductor ground plane.

18. The RF front end module of claim 15, in which a size of the inductor ground plane is larger than the outline of the first inductor and the second inductor.

19. The RF front end module of claim 15, in which a metal density of the conductive layer of the first substrate is balanced by a conductive fill pattern of the first substrate.

20. The RF front end module of claim 15, incorporated into at least one of a music player, a video player, an entertainment unit, a navigation device, a communications device, a personal digital assistant (PDA), a fixed location data unit, a mobile phone, and a portable computer.

* * * * *